(12) United States Patent
Reinhardt

(10) Patent No.: US 6,747,243 B1
(45) Date of Patent: Jun. 8, 2004

(54) SPOT CLEANING OF PARTICLES AFTER INSPECTION

(75) Inventor: Karen Reinhardt, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/328,835

(22) Filed: Dec. 24, 2002

(51) Int. Cl.$^7$ ................................................ B23K 26/36
(52) U.S. Cl. ................................................ 219/121.69
(58) Field of Search ...................... 219/121.69, 121.68, 219/121.67, 121.78, 121.81, 121.83, 121.85; 700/159, 166

(56) References Cited

U.S. PATENT DOCUMENTS

| | | | |
|---|---|---|---|
| 4,898,471 A | * | 2/1990 | Vaught et al. ............ 356/394 |
| 5,024,968 A | | 6/1991 | Engelsberg |
| 5,099,557 A | | 3/1992 | Engelsberg |
| 5,141,602 A | * | 8/1992 | Chen et al. ............... 205/103 |
| 5,531,857 A | | 7/1996 | Engelsberg et al. |
| 5,643,472 A | | 7/1997 | Engelsberg et al. |
| 5,669,979 A | | 9/1997 | Elliott et al. |
| 5,800,625 A | | 9/1998 | Engelsberg et al. |
| 5,814,156 A | | 9/1998 | Elliott et al. |
| 5,821,175 A | | 10/1998 | Engelsberg |
| 5,865,901 A | | 2/1999 | Yin et al. |
| 5,958,268 A | | 9/1999 | Engelsberg et al. |
| 6,038,015 A | * | 3/2000 | Kawata ....................... 355/67 |
| 2001/0025924 A1 | * | 10/2001 | Uto et al. .................... 250/307 |

FOREIGN PATENT DOCUMENTS

EP WO98/10886 3/1998

* cited by examiner

*Primary Examiner*—Tom Dunn
*Assistant Examiner*—Jonathan Johnson
(74) *Attorney, Agent, or Firm*—DeLio & Peterson, LLC; Kelly M. Reynolds

(57) ABSTRACT

A method and cluster tool for selectively removing contaminating particles from a substrate surface using a laser. An inspection tool scans the substrate surface to detect and identify any defects on the substrate surface, and then suitable software analyzes the scanned data to determine characteristics of the defect including the type of defect, the number of defects, sizes of each defect and the planar x, y coordinates of each defect. This data is used to command a laser tool to remove only those defects identified as contaminants that are capable of being removed from the surface of the substrate and may be detrimental to subsequent substrate processing techniques. The laser contacts this identified contaminant at its x, y coordinates to remove only such contaminant while not substantially treating or directly contacting the area surrounding the contaminant, thereby preventing damaging or altering the substrate surface.

18 Claims, 3 Drawing Sheets

SPOT CLEANING OF PARTICLES AFTER INSPECTION

BACKGROUND OF THE INVENTION

1. Field of the Invention

This invention relates generally to surface cleaning, and more particularly, to a method and apparatus for spot cleaning contaminates from a surface of a substrate, such as, a semiconductor wafer used to make electronic components.

2. Description of Related Art

The fabrication of electronic components is very exacting and complex, often requiring a number of processing steps with extreme precision to form the desired circuit pattern on the component substrate. Any contamination on the substrate surface may cause short circuits, open circuits and other defects in the component that can cause the component to fail and/or adversely affect the performance thereof. For example, a single particulate contaminate as small as 100 angstroms in diameter can result in a fatal defect in a modern microcircuit electronic component. Thus, any contamination on the surface of an electronic component has a direct bearing on its process yields, rendering the component less efficient or even inoperable for its intended purpose. Accordingly, cleaning surfaces of the semiconductor substrate is a critical step in manufacturing semiconductor components, such as, integrated circuits, memory chips, thin film heads, flat panel displays, and CD-ROMs.

There are currently numerous methods used to clean substrate surfaces in the electronic industry including both chemical and mechanical cleaning techniques. For example, wet chemical cleaning, dilute or vapor hydrofluoric acid cleaning, megasonic and ultrasonic cleaning, ultraviolet and ozone cleaning, brush cleaning, supercritical fluid cleaning and laser-assisted liquid cleaning are all used to clean particles from a substrate surface. However, as modern semiconductor devices continually decrease in size, each of these cleaning processes is undesirable as each have serious drawbacks requiring the use of cleaning tools and agents that may introduce as many new contaminants to a treated substrate surface as they remove, as will be discussed further below. Furthermore, each of the above cleaning processes also require that the entire surface area of the substrate be treated or cleaned to remove any contaminants thereon, thereby cleaning undesired or uncontaminated areas and even possibly damaging the substrate surface itself.

For example, wet chemical cleaning consists of introducing the entire substrate into a series of baths in aqueous hydrochloric acid (HCl), hydrogen peroxide, and water. Successive lots of wafers introduced into these baths are then exposed to particles from earlier lots thereby potentially depositing thereon and contaminating the surfaces of these subsequent lots of wafers. The dilute hydrofluoric acid cleaning also causes micro-etching of the substrate surface, as well as leads to residual fluorine molecules which can breakdown an oxide in gate stacks and adversely affect other electrical parameters of a chip. Vapor hydrofluoric acid cleaning has been introduced into cluster tool systems, however, these cleaning systems typically lead to residual fluoride, chlorine, and hydride ions on the substrate surfaces, which in turn, lead to degradation of parametric performance or cause problems in downstream processing techniques.

Megasonic and ultrasonic cleaning remove organic films, ionic impurities and contaminate particles from the substrate surface by hydrostatic forces created in combination with the chemical solution. However, both megasonic and ultrasonic cleaning techniques operate on the principal of immersing a substrate in a chemical solution and applying megasonic or ultrasonic devices to impart high energy sonic waves to the components thereby undesirably treating the entire surface area of such components.

The ultraviolet/ozone cleaning processes may cause downstream adhesion processing problems as well as attract unwanted contaminants from any downstream cleaning process. Further, the ultraviolet/ozone cleaning processes have proven not to be effective in the removal of certain contaminants such as, for example, salt, dust, fingerprints, and polymers degraded by ozone. Brush cleaning is also undesirable for cleaning smaller, modern semiconductor devices as it is typically performed with a chemical solution to remove particles as small as 1.0 $\mu$m from the substrate surface whereby the brush, brush material and chemical solutions may damage the substrate surface. Supercritical fluid technology is also undesirable as it consists of using an aerosol gas stream of frozen gas particles directed at the contaminants at a high velocity to "sandblast" the substrate surface for removal of the contaminants there-from. Concerns with the use of this technique include thermal shock to the wafer, sub-surface ion migration, surface structural damage, and electrical parametric damage.

Laser-assisted liquid cleaning is also used to clean substrate surfaces. This cleaning technique entails cleaning a substrate surface with a liquid, such as water or water and alcohol, super-heated using a laser as the heat source. In so doing, the solution penetrates into the interstice between the particle and the substrate surface whereby it is rapidly heated by a pulse from the laser to propel the particle from the substrate. A problem realized by laser-assisted liquid cleaning includes penetrating the solution under metal lines on a patterned substrate whereby the metal lines are lifted off the substrate to not only damage the circuitry itself but also generate particles thereon the surface. Laser-assisted liquid cleaning techniques may also cause ablation effects on a patterned surface. Also, wherein the laser-assisted liquid cleaning technique further includes propelling a stream of gas from a gas source across the surface of the substrate to remove the contaminants, it has been found that damage to the entire surface area of the substrate may result.

Other known methods for cleaning substrate surfaces avoid the use of outside wet solutions such as, for example, surface melting, annealing and ablation. However, these techniques also have their own drawbacks, as discussed further below, as well as treat or clean the entire surface area of the substrate.

Surface melt processes require that the treatment surface be melted to release contaminants which are then removed by ultra high vacuum pressure. This method has the disadvantage that the entire surface being treated must be briefly melted which may be undesirable, as for example when a semiconductor surface is cleaned between deposition of circuit layers and it is desired that the integrity of the previously deposited layers not be disturbed. A further disadvantage with this process is that ultra high vacuum equipment is both expensive and time consuming to operate.

Annealing methods suffer similar drawbacks whereby the crystal structure of the material of the surface being treated is rearranged across the entire surface area and contaminants are removed by ultra high vacuum. With ablation, contaminants on a surface are heated to the point of vaporization, however, it is difficult to vaporize the contaminant without also damaging the underlying treatment surface. Further, surface cleaning by melting, annealing and ablation may be conducted using a laser energy source, however, the use of a laser energy source to remove contaminants from a surface by melting, annealing, or ablation does not overcome the inherent disadvantages of these processes, i.e., the rearrangement and melting of the entire treatment surface.

Still other known cleaning techniques include those that employ momentum transfer as a means to impinge and dislodge the contaminant particles from the substrate surface. For example, pressurized gas or fluid jet spray cleaning removes the contaminants by spraying the substrate surface at predetermined angles, while cryogenic aerosol cleaning, discussed above, uses pressurized frozen particles to "sandblast" the contaminant surfaces. Momentum transfer cleaning techniques are problematic for future generations of smaller semiconductor technology as they increase the risk of damaging the substrate surfaces due to the high pressure at which the gas, fluid or aerosol impacts the surface; they often spray or bombard the entire substrate surface regardless of the location, size and number (i.e., density) of the contaminates; they can electrostatically damage the treatment surface due to the presence of ions in the cleaning fluid; the high impacting velocities and often indiscriminant cleansing of the entire substrate surface unnecessarily exposes and subjects already clean areas to potential damage and they are both time consuming and costly.

U.S. Pat. No. 5,865,901 discloses removing contaminants by dispensing an impinging stream of cleaning agent having a diameter ranging from 0.15 mm to 2 mm along a path. However, due to the high pressure and the large diameter of the impinging stream, any area immediately surrounding the contaminated area is also impinged by the stream of cleaning agent. For example, when the stream of cleaning agent impinges a contaminant located directly adjacent metal lines on a patterned substrate, the stream of cleaning agent not only impinges the contaminant itself but also the immediately surrounding area, i.e., the metal lines, thereby potentially lifting off these metal lines and damaging the circuitry itself, in addition to generating particles thereon the substrate surface. The impinging stream of cleaning agent not only risks damaging the immediately surrounding area due to the high pressure at which the cleaning agent impacts the surface, but also unnecessarily exposes these non-contaminated areas to potential damage, thereby potentially causing degradation of parametric performance and problems with downstream processes. The above is especially true with contaminants that are relatively small in size, such as those contaminants having diameters less than the smallest dimension of the impinging stream of cleaning agent, i.e., less than 0.15 mm. Furthermore, the cleaning agent of the impinging stream is limited to the removal of particular contaminants depending on the chemistries of both the cleaning agent and the contaminant, as well as the cleaning agents possibly introducing as many new contaminants to the treated surface as they remove.

Accordingly, as semiconductor technology continues to decrease in size, substrate contamination and removal thereof continues to be a problem in the art. Accordingly, a need continues to exist for improved apparatus and methods for the removal of contaminants, particularly those contaminants of relatively small dimensions, on the continually decreasing substrate surface. A more effective and efficient cleaning method and apparatus to remove contaminants from substrate surfaces is required to produce more advanced, complex electronic and semiconductor components.

Bearing in mind the problems and deficiencies of the prior art, it is therefore an object of the present invention to provide an improved method and apparatus for removing contaminants from a surface, such as a substrate surface used to make electronic components.

A further object of the present invention is to provide a method and apparatus for identifying, targeting and removing different contaminants on a substrate surface.

Another object of the present invention is to provide a method and apparatus for removing targeted contaminants from a substrate surface without cleaning the entire substrate surface.

Still another object of the present invention is to provide a method and apparatus for removing targeted contaminants from a substrate surface without treating, damaging and/or altering the area substantially immediately surrounding the contaminated area to be cleaned.

It is another object of the invention is to provide a method and apparatus for removing contaminants from the surface of a substrate while preventing redeposition of such contaminants onto the substrate surface.

Yet another object of the invention is to provide a method and apparatus for removing contaminants from the substrate surface that introduces substantially no additional impurities to the substrate surface.

Another object of the present invention is to provide a method and apparatus for removal of contaminants from a substrate surface while maintaining substrate integrity.

Still another object of the present invention is to provide a method and apparatus for effectively and easily removing contaminants from a substrate surface.

Still other objects and advantages of the invention will in part be obvious and will in part be apparent from the specification.

SUMMARY OF THE INVENTION

The above and other objects, which will be apparent to those skilled in art, are achieved in the present invention, which, is directed to in a first aspect a method for removing undesirable contaminants from a substrate surface. The method includes locating at least one defect on a substrate surface and identifying the planar coordinates of the at least one defect. It is then determined whether the at least one defect is a killer defect. If the defect is a killer defect, this killer defect is removed using a laser by positioning the killer defect in the direct path of a laser beam emitted from the laser, whereby the laser beam contacts the killer defect to enable selective removal of the killer defect by laser ablation while leaving the substrate surface area surrounding the killer defect intact. Preferably, the laser beam directly contacts only the killer defect.

In locating and identifying the exact planar coordinates of the at least one defect the substrate surface is scanned to locate either killer defects, non-killer defects or light point defects, and then this scanned data is used to determine the x, y coordinates of the defect.

In determining whether the defect is a killer defect the method includes the steps of determining planar coordinates of any substrate surface topography, such as, dense array information, active areas, memory areas and cell areas. The planar coordinates of the substrate surface topography are then compared to x, y coordinates of the defect to determine if the at least one defect would interfere with subsequent downstream processing of the substrate. If the defect does interfere with subsequent downstream processing, it is classified as a killer defect that must be removed in accordance with the invention. If the defects do not interfere with subsequent downstream processing it is classified as a non-killer defect and may remain on the substrate surface. Likewise, if it is determined that the defect is an uncorrectable light point defect, it may also remain on the substrate surface.

Preferably, the laser beam emitted from the laser removes killer defects, having diameters ranging from about 0.1 $\mu$m to about 0.251 $\mu$m, from substrates including silicon, quartz, metal, rubber, plastic, cotton, cellulose and ceramics. The killer defects that may be removed in accordance with the invention include, but are not limited to, solder flux residues, slurries, photoresist, adhesive residues, plasticizers, unreacted monomers, dyes, paints, dielectric fluids, oils, greases, lubricants, fine dust, dirt particles, molybdenum alloys, nickel/iron alloys, stainless steel, titanium, tantalum, tungsten, copper, cobalt, erbium, zirconium, oxidation residues, polycrystalline silicon, silicon, silicon dioxide, silicon nitride, titanium nitride, aluminum and aluminum oxide.

The laser used to remove the killer defects may include a solid state laser, a gas laser or a semiconductor laser. However, the laser is preferably a femtosecond laser that removes the killer defect at a rate that is faster than the substrate can be heated thereby avoiding substrate surface damage. The femtosecond laser emits a laser beam having a diameter substantially the same size as a diameter of a targeted killer defect to be removed so that the laser beam contacts the targeted killer defect.

In a second aspect of the invention, another method is disclosed for removing undesirable contaminants from a substrate surface including scanning a substrate surface to locate defects thereon the substrate surface and identifying x, y coordinates of each of the plurality of defects and any surface topography. The x, y coordinates of each of the plurality of defects are then compared to x, y coordinates of substrate surface topography to determine whether each of the plurality of defects is a defect selected from the group consisting of a killer defect, a non-killer defect and a light point defect. Those defects identified as either non-killer defects or light point defects are allowed to remain on the substrate surface. However, those defects identified as killer defects are removed using a laser. The killer defect is positioned in the direct path of a laser beam emitted from the laser whereby the laser beam directly contacts the killer defect to enable selective removal of the killer defect by laser ablation while leaving the substrate surface area surrounding the killer defect intact.

In this aspect, both the killer defects and the laser beam have diameters ranging from about 0.1 $\mu$m to about 0.25 $\mu$m so as to remove each of the killer defects at the respective x, y coordinates. The laser beam may be adapted to simultaneously remove a plurality of defects identified as killer defects by attaching diffraction graters, mirrors and optics to the laser tool.

Preferably, this laser tool comprises a femtosecond laser that emits a laser beam having a diameter the same size as a diameter of a targeted killer defect to be removed so that the laser beam contacts the targeted killer defect at its x, y coordinates, the laser beam removing the killer defect at a rate that is faster than the substrate can be heated thereby avoiding substrate surface damage.

In a third aspect, the invention is directed to an apparatus for removing undesirable contaminants from a substrate surface. The apparatus at least includes an inspection tool, a software component, a controller device and a laser tool for removing killer defects at their exact planar coordinates. The inspection tool scans a substrate surface to locate defects thereon the substrate surface while the software component analyzes the scanned date from the inspection tool to determine whether the defects comprise killer defects and the exact planar coordinates of each of these killer defects. The controller device is commanded by the software component to manipulate a laser tool to remove only those defects identified as the killer defects. The laser tool removes only the killer defects by positioning each of the killer defects in the direct path of a laser beam emitted from the laser whereby the laser beam directly substantially contacts only each of the killer defects to enable selective removal of each of the killer defects by laser ablation while leaving the substrate surface area immediately surrounding each of the killer defects intact.

Preferably, the laser comprises a femtosecond laser that emits a laser beam having a diameter the same size as a diameter of a targeted killer defect to be removed so that the laser beam directly contacts the targeted killer defect at its exact x, y coordinates. The femtosecond laser removes the killer defect at a rate that is faster than the substrate can be heated thereby avoiding substrate surface damage.

In determining whether a defect is a killer defect, the software component determines whether the located defects comprise killer defects by comparing substantially exact x, y coordinates of each of the located defects to substantially exact x, y coordinates of any identified substrate surface topography.

The apparatus may further include a beam splitter, such as diffraction graters, mirrors or optics, attached to the laser tool in order to split a beam emitted from the laser tool for simultaneously removing a plurality of defects identified as killer defects.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
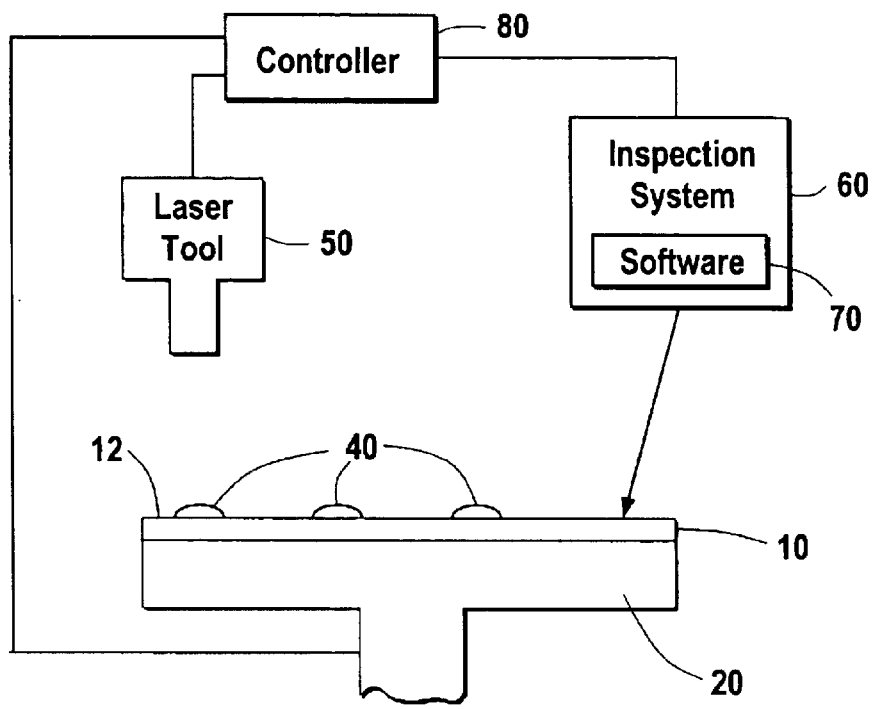
FIG. 1A is schematic illustrations of a cleaning system of the invention used to remove contaminating particles from a substrate surface.

In describing the preferred embodiment of the present invention, reference will be made herein to FIGS. 1A–3 of the drawings in which like numerals refer to like features of the invention.

The present invention is applicable to cleaning processes for cleaning a wide variety of substrates such as circuit boards, medical instruments and optical lenses, and in particular, electronic component substrates such as semiconductor wafers used in the fabrication of integrated circuits.

For ease of understanding the invention, the following description will be directed to semiconductor wafers used in electronic component fabrication, such as semiconductor devices or integrated circuits (ICs), although it will be appreciated by those skilled in the art that other substrates may suitably be cleaned using the methods and apparatus of the invention. For example, the instant invention may be used to clean surfaces of ICs including memory circuits and logic devices, whereby such ICs may be used, for example, in consumer electronic products such as computer systems, office equipment including copiers and printers, cellular phones, personal digital assistants (PDAs), and other electronic products. Furthermore, it will be appreciated by those skilled in the art that other surfaces, including those that are not related to semiconductor wafers, may suitably be cleaned using the methods and apparatus of the invention such as, for example, in the manufacture and purification of culture strains and cleaning of surgical instruments in the biotechnology and medical fields, wherein the periodic cleaning of these components during manufacturing maintains product integrity.

The particle size of the contaminants to be removed from a substrate surface in accordance with the invention include those contaminants having diameters as low as about 0.1 $\mu$m, or even lower, and those contaminants having diameters up to about 0.25 $\mu$m, or higher. Preferably, the invention removes contaminants having diameters ranging from about 0.1 $\mu$m to about 0.25 $\mu$m.

Broadly stated, the invention comprises a method and cluster tool for cleaning semiconductor wafer substrates at least including locating any defects on a surface of a substrate and selectively removing only those identified defects that may interfere with subsequent downstream processing techniques, and which are capable of being removed, using a laser. Preferably, the cluster tool of the invention includes an inspection tool and a defect removal apparatus. The inspection tool scans the surface of a substrate to detect and identify any defects on the surface of the substrate, and then suitable software analyzes the scanned data to determine characteristics of the defect including the type of defect, the number of defects, sizes of each defect, and substantially the exact planar x, y coordinates of each defect. The processed data is then employed to direct the removal apparatus, preferably a laser tool, to remove only those defects identified as contaminants that are capable of being removed from the surface of the substrate and may be detrimental to subsequent substrate processing techniques. In so doing, the laser directly substantially contacts only the identified contaminant at its x, y coordinates to remove the located contaminant. Preferably, the laser does not substantially treat or contact the area surrounding the contaminant. More preferably, the laser does not treat or contact the area immediately surrounding the contaminant. The invention advantageously prevents having to treat the entire surface area of the substrate thereby avoiding treating, damaging and/or altering the entire surface area, and in particular, avoiding treating, damaging and/or altering the area surrounding the located contaminant which is to be removed.

Figure 1B:
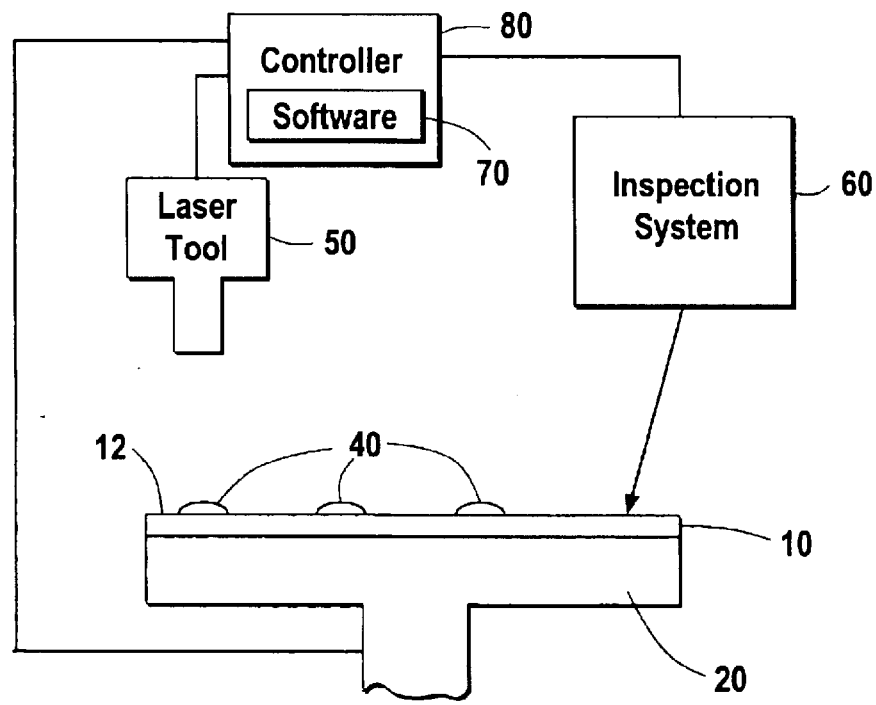
FIG. 1B is schematic illustrations of an alternate cleaning system of the invention used to remove contaminating particles from a substrate surface.
Figure 1C:
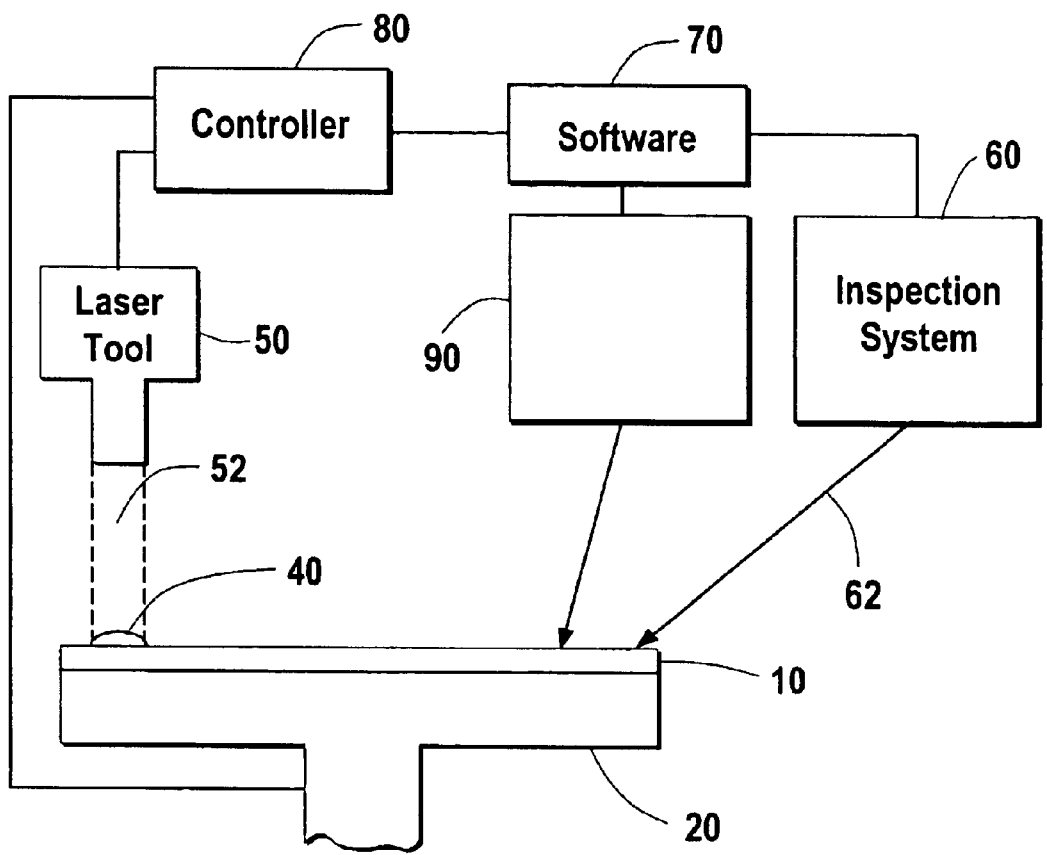
FIG. 1C is schematic illustrations of still another alternate cleaning system of the invention used to remove contaminating particles from a substrate surface.

Referring to FIGS. 1A–C, a substrate 10 is provided on a substrate holder 20 as known and used in the art for detection and removal of contaminants from a surface thereof. Typical substrates from which contaminants may be removed in accordance with the present invention include, but are not limited to, substrates formed of silicon, quartz, metal, rubber, plastic, cotton, cellulose, ceramics, and other organic or inorganic materials. The substrate 10 may be positioned on the substrate holder 20 relative to a laser tool 50 for removal of contaminants from the substrate surface, whereby the substrate holder moves the substrate relative to the laser tool to position the contaminants on the surface of the substrate directly in line with the path of the laser. Alternatively, the substrate holder 20 may be stationary, with the laser tool 50 moving relative to the substrate holder 20 for removal of contaminants from the substrate surface. Still further, both the substrate holder 20 and the laser tool 50 may move relative to each other in order to position the contaminant on the substrate surface in the line of path of the laser provided by the laser tool 50 for removal of such contaminant.

Once the substrate 10 is positioned on the substrate holder 20, any defects 40 on the surface of the substrate including, for example, particulate contaminants, non-particulate contaminants, light point defects, and the like, are then detected and located by scanning the substrate surface. These defects may be detected and located manually, i.e., visually, or by any known particle detecting and locating system used in the art. Preferably, an inspection system 60 is used to optically or electronically scan the substrate surface for any defects thereon, as shown by reference numeral 62. The inspection system may include any known inspection tool, such as, those employing optical or scanning electron microscope (SEM) instruments. For example, the inspection system may include, the KLA/Tencor Corp. (e.g., models 7700, 6420 or AIT) of Milpitas, Calif.; which scan and inspect the surface of the substrate for defects including particulate and non-particulate contaminants, light point defects and the like.

Once the substrate surface 12 is scanned for defects, a suitable software component 70 of the invention, or the like, receives the scanned data obtained from the inspection system 60. The software component 70 may be an internal system software within the inspection system 60 as shown in FIG. 1A, it may be an internal system software within a controller system 80 of the invention as shown in FIG. 1B, or it may be an independent software system, external thereto the inspection system 60 and the controller system 80 as shown in FIG. 1C. The software component 70 processes the scanned defect data from the inspection system to determine substantially the exact x, y coordinates of each defect on the substrate surface, the type of defect, the composition of the defect, the number of defects and the size of each defect. Accordingly, the inspection system 60 at least scans the surface of the substrate to detect and identify any particulate or non-particulate defects on the substrate surface and then the software component 70 at least analyzes such information to obtain the type of defect and the x, y coordinates of such defects.

In determining the type of defect, the software component 70 analyzes the scanned information from the inspection system 60 to determine whether the located defects are contaminants thereon the surface of the substrate which are capable of being removed, including killer and non-killer defects as discussed further below, or other surface defect topography unable to be removed, such as, light point defects. Wherein the located defects are identified as contaminants, the software component 70 is further adapted to identify the materials or composition of each located contaminant. Alternatively, once the x, y coordinates of the contaminants are identified the substrate may be moved to an external, separate analytical tool 90 for analyzing contaminate composition. The analytical tool 90 is adapted to pinpoint substantially the exact location of each contaminant and determine the composition of such contaminants. The software component 70 then receives this contaminant composition information from analytical tool 90 for further analysis.

Contaminating materials, including particulate contaminants, which may be located, identified and removed from a substrate surface in accordance with the invention include, but are not limited to, solder flux residues, slurries, photoresist, adhesive residues, plasticizers, unreacted monomers, dyes, paints, dielectric fluids, oils, greases, lubricants, fine dust, dirt particles and the like. Further particulate contaminants include both organic contaminants and inorganic contaminants including, for example, removing oxidation from chromium, molybdenum alloys, nickel/iron alloys, stainless steel, titanium, tantalum, tungsten, copper, cobalt, erbium, zirconium and the like, as well as removing polycrystalline silicon from quartz. Still further contaminants that may be removed in accordance with the invention are silicon, silicon dioxide, silicon nitride, titanium nitride, aluminum and aluminum oxide.

The inspection system 60 may further be used to detect and locate substrate surface topography. Once located, the surface topography information is forwarded to software component 70 for analysis of the type of topography, i.e., whether the topography includes dense array information, active areas, memory areas, cell areas and the like. The software component 70 also analyzes the forwarded, scanned topography data to determine the x, y coordinates of each detected topographic feature, the size of the topography and the number of topographic features located. Alternatively, known x, y coordinates of any known or previously identified surface topography, which may be gathered visually or by a known scanning technique, may be programmed or forwarded to the software component 70 manually or via known techniques.

The invention then determines whether the identified contaminants are "killer" defects or "non-killer" defects by comparing the locations of any identified defects on the substrate surface to the locations of any identified surface topography. Both the identified contaminant information and the substrate surface topography are forwarded to software component 70. Software component 70 compares the identified planar x, y coordinates of the defects to the identified planar x, y coordinates of any surface topography. If it is determined that the contaminant is located in an area that will be detrimental to further downstream processing of the substrate, i.e., in a dense array or on an active site, memory area or cell area, it is classified as a killer defect and will be subsequently removed using laser tool 50. Killer defects have the potential to electrically cause a short or an open in the electrical circuitry of the device, either vertically or horizontally, thereby potentially causing failures in downstream processing of the substrate. Conversely, if it is determined that the contaminant is located in an area that would not interfere with future downstream processing, i.e., in a non-dense area or not on an active site, memory area or cell area, the contaminant is classified as a non-killer defect and may remain on the substrate surface thereby decreasing the amount of time required to clean the substrate surface.

Figure 2:
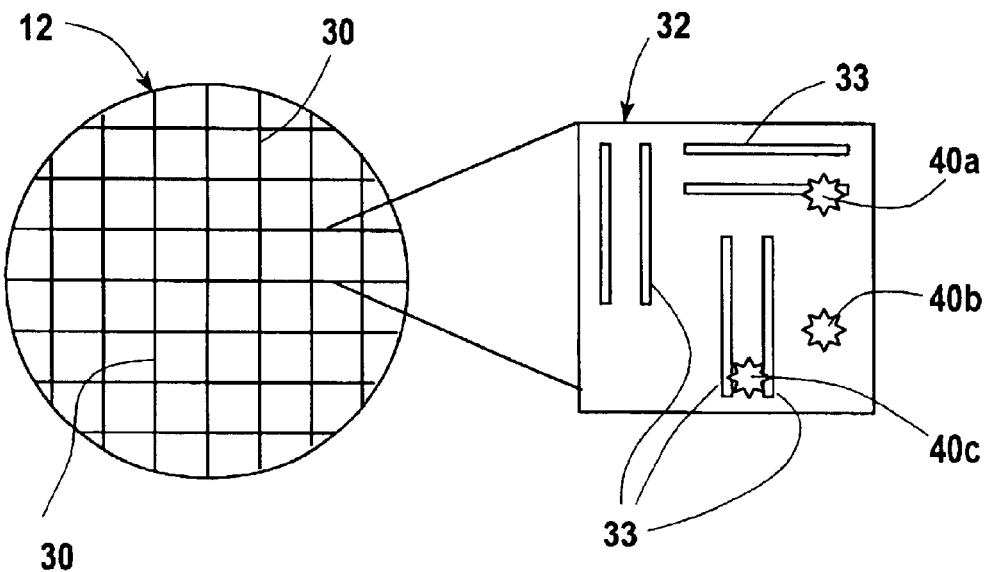
FIG. 2 illustrates a grid array on a substrate surface and an enlarged view of at least one of such grid arrays showing the different types of contaminating particles located on the substrate surface.

For example, as shown in FIG. 2, a portion of a wafer surface 12 contains a grid array 30 with each grid comprising, for example, a die on the wafer. An exploded version 32 of at least one of the grids of grid array 30 is shown illustrating metal lines 33 on the die and a plurality of contaminants 40a, 40b and 40c thereon the substrate surface. As illustrated, contaminant 40a is a killer defect that is located on a metal line 33 creating an open therein the metal line. The open in the metal line prevents the metal on either side of the contaminant 40a from contacting each other, thereby preventing electrical current from flowing across adjacent metal lines 33. Another killer defect, as shown by contaminant 40c is located between two adjacent metal lines 33 causing an electrical current to undesirably flow from one metal line over to the adjacent metal line thereby creating a short between these metal lines. Conversely, a non-killer defect is illustrated by contaminant 40b. As non-killer defects are not detrimental to subsequent processing of the substrate, identified non-killer defects may remain on the substrate surface. Accordingly, the invention is directed to removing only those contaminants identified as killer defects.

The software component 70 also determines whether an identified defect is considered an uncorrectable or irremovable defect, such as, a light point defect. Light point defects include those defects that are non-particulate in structure causing topographical defects on the substrate surface, such as, but not limited to, pits, gauges and scratches in the substrate material. The inspection system 60 scans the substrate surface to locate any defects thereon the surface. This scanned data is forwarded to the software component 70 for determining the type of defect, particularly whether the defect is a light point defect, as well as the x, y coordinates of any light point defects and the number and size of any light point defects. Accordingly, the software component 70 is able to differentiate contaminants, including both killer and non-killer defects, from light point defects for commanding the laser tool to clean only those defects identified as killer defects, thereby decreasing the costs and cleaning time of the substrate.

Figure 3:
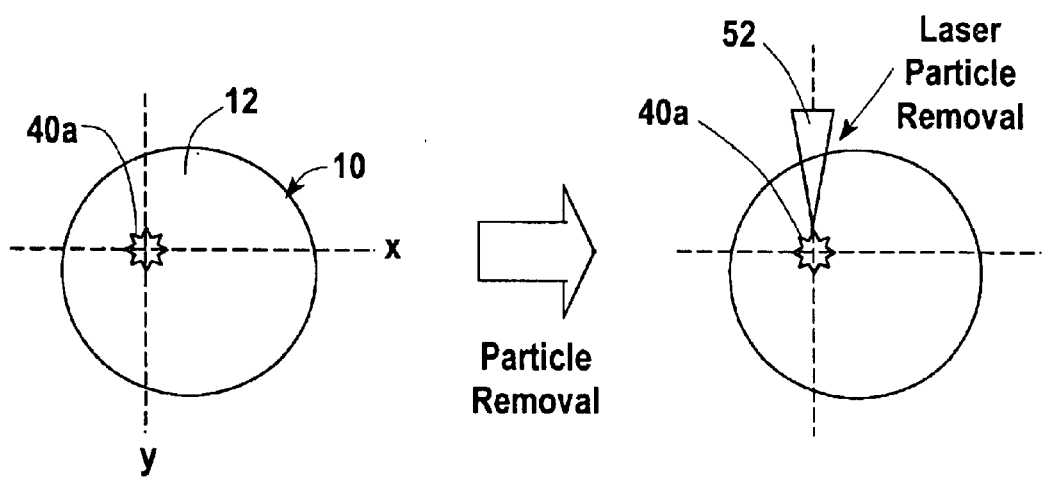
FIG. 3 illustrates the cleaning system and method of the invention whereby coherent light from a laser beam is used to directly contact a pinpointed contaminant on a substrate surface for removal therefrom.

Once the type of defect, the number of defects, the size of each defect and the x, y coordinates of each defect are determined, the software component 70 forwards this information to a controller device 80. The controller device 80 is then commanded to manipulate the laser tool 50 to remove only certain ones of the detected and identified defects, i.e. only killer defects, as shown in FIG. 3. In removing these killer defects, the controller device 80 commands the substrate holder 20 to move, while the laser tool remains stationary, to position the identified defect 40 on the surface 12 of the substrate 10 in the direct path of an output laser beam 52 emitted from laser tool 50 for removal of such defect 40. Alternatively, the controller device 80 may command the laser tool 50 to move, while the substrate holder 20 remains stationary, to position the output laser beam 52 emitted directly in the path of the identified defect on the surface of the substrate for removal thereof. Still further, the controller device 80 may command both the substrate holder 20 and the laser tool 50 to move simultaneously to each other in order to position the laser beam emitted from the laser tool in the direct path of the identified defect on the surface of the substrate for removal of the defect.

The laser tool 50 may include any known laser device that emits a coherent laser beam 52, such as, a solid state laser, a gas laser, semiconductor lasers or light emitting diodes and the like. Preferably, the laser tool 50 comprises a femtosecond laser 50 that sends out pulses at 100X10E-15 seconds. Femtosecond laser 50 removes the identified killer defects at a rate that is faster than the substrate can be heated or shocked, e.g., it emits short pulses that last 50 to 1,000 femtoseconds (or quadrillionths of a second) thereby avoiding any possible surface damage to the substrate and leaving the area immediately surrounding the killer defects in its original state. The coherent light of the laser beam 52 focuses in and contacts the identified killer defects at their x, y coordinates, as such, the femtosecond laser 50 does not contact, damage or alter the surface area of the substrate surrounding the removed killer defects. Preferably, the femtosecond laser 50 focuses in and contacts only the identified killer defects at their exact x, y coordinates thereby not contacting any area substantially, immediately surrounding these killer defects.

In accordance with the invention, the emitted laser beam may have a smaller diameter than the diameter of the targeted killer defect, whereby the emitted laser beam must contact the killer defect continuously over the entire area of the killer defect's x, y coordinates so as to completely remove the entire killer defect. However, in the preferred embodiment, the laser beam emitted from femtosecond laser tool 50 has a diameter the same size as the diameter of the targeted killer defect to be removed so that the laser beam contacts the targeted killer defect at its x, y coordinates. In so doing, the diameter of the laser beam 52 may be adjusted to the exact diameter dimension of the killer defect being removed so that the laser beam and the killer defect have the same diameters, thereby enabling the laser tool to remove only such contaminants.

In adjusting the diameter of the laser beam 52, the invention advantageously ensures that the laser beam 52 contacts the killer defect at its x, y coordinate, and does not substantially contact any area surrounding the killer defect. This is advantageous as those identified defects having diameters ranging from about 0.1 $\mu$m to about 0.25 $\mu$m have greater adhesion forces between the defect and the substrate surface as a result of these smaller dimensions, thus making it more difficult to remove such defects. As shown in FIG. 1C, the adjustment of the diameter of the laser beam 52 causes the laser beam to be directed at the identified defect 40 thereby concentrating all of the coherent laser light at the targeted defect 40 to remove such defect by thermal shock. Preferably, the coherent laser light does not substantially contact any other surface area of the substrate. Alternatively, the emitted laser beam may have a smaller diameter than the diameter of the targeted killer defect, whereby the emitted laser beam must contact the killer defect continuously over the entire area of the killer defect's x, y coordinates so as to completely remove the entire killer defect. Further, the femtosecond laser tool 50 removes the identified killer defects indiscriminant of the material or composition of such killer defects as a result of the laser beam removing the defects by thermal shock. Thus, it is not necessary to adjust or change femtosecond laser tool 50 based on the composition of the defect.

In an alternate embodiment of the invention, the laser beam 52 from laser tool 50 may be adapted to remove a plurality of identified contaminants simultaneously. In so doing, the software component pinpoints the x, y coordinates of a number of identified defects and commands the laser tool 50 to remove such identified defects at the number of x, y coordinates at the same time. The laser beam 52 emitted from laser tool 50 is split to remove these several pinpointed contaminating particles simultaneously in a single step. Splitting of the laser beam 52 may be accomplished by known techniques including, for example, using a diffraction grater, using more than one optics and using mirrors with reflectivity. Still further, the invention may be used to simultaneously or sequentially clean both sides of the substrate surfaces.

Optionally, once the defect is removed from the substrate surface, a cool gas flow, such as a nitrogen flow, may be provided over the substrate surface to carry away the removed defect and prevent redeposition of the defect on another area of the substrate surface.

Thus, in the invention, the software component 70 analyzes the scanned data from the inspection system 60 to determine the type of defect, the number of defects, the size of each defect and the x, y coordinates of each defect. The software component also determines whether a located defect is a contaminant on the substrate surface or an uncorrectable defect on the substrate surface, such as, a light point defect. If the defect is a contaminant, the software component 70 further determines whether the contaminant is a killer defect, which must be removed using laser tool 50, or a non-killer defect, which may remain on the surface of the substrate. Once it is determined that the defect 40 is a killer defect, the software component 70 forwards this information to the controller device 80 which in turn manipulates the laser tool 50 to remove only those identified killer defects at their x, y coordinates. The invention advantageously avoids treating the entire substrate surface area by cleaning only those contaminants identified as killer defects, thereby reducing cleaning times and costs and avoiding any further undesirable surface cleaning that may lead to damaging the substrate surface. Processing times and costs are further reduced in accordance with the invention by determining whether uncorrectable defects exist, and if too many of these uncorrectable defects exist, discarding the substrate as a large number of these defects are detrimental to the substrate itself and further downstream processing techniques. The invention may be a stand-alone system or coupled with other substrate manufacturing equipment for downstream processing steps such as, for example, coupled with a deposition tool.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for removing undesirable contaminants from a substrate surface comprising the steps of:

locating at least one defect on a substrate surface;

identifying the planar coordinates of the at least one defect;

determining whether the at least one defect is a killer defect on the substrate surface; and removing the killer defect using a laser by positioning the killer defect in the direct path of a laser beam emitted from the laser whereby the laser beam contacts the killer defect to enable selective removal of the killer defect by laser ablation while leaving the substrate surface area surrounding the killer defect substantially intact.

2. The method of claim 1 wherein the laser beam emitted from the laser removes killer defects having diameters ranging from about 0.1 $\mu$m to about 0.25 $\mu$m.

3. The method of claim 1 wherein the substrate comprises a material selected from the group consisting of silicon, quartz, metal, rubber, plastic, cotton, cellulose and ceramics.

4. The method of claim 1 wherein the killer defect comprises a material selected from the group consisting of solder flux residues, slurries, photoresist, adhesive residues, plasticizers, unreacted monomers, dyes, paints, dielectric fluids, oils, greases, lubricants, fine dust, dirt particles, molybdenum alloys, nickel/iron alloys, stainless steel, titanium, tantalum, tungsten, copper, cobalt, erbium, zirconium, oxidation residues, polycrystalline silicon, silicon, silicon dioxide, silicon nitride, titanium nitride, aluminum and aluminum oxide.

5. The method of claim 1 wherein the laser beam substantially contacts the killer defect at its planar coordinates to enable selective removal of the killer defect by laser ablation.

6. The method of claim 1 wherein the laser comprises a femtosecond laser that removes the killer defect at a rate that is faster than the substrate can be heated thereby avoiding substrate surface damage.

7. The method of claim 6 wherein the femtosecond laser emits a laser beam having a diameter the same size as a diameter of a targeted killer defect to be removed so that the laser beam contacts the targeted killer defect at its planar coordinates.

8. The method of claim 1 further including the step of flowing a gas over the substrate surface to carry away the removed killer defect, thereby preventing redeposition of the removed killer defect on another area of the substrate surface.

9. The method of claim 1 wherein the steps of locating and identifying the planar coordinates of the at least one defect comprise:

scanning the substrate surface to locate the at least one defect comprising a defect selected from the group consisting of killer defects, non-killer defects and light point defects; and determining the planar coordinates of the at least one defect by analyzing the scanned substrate surface data.

10. The method of claim 9 wherein the step of determining whether the at least one defect is a killer defect on the substrate surface comprises:

providing substrate surface topography;

determining planar coordinates of the substrate surface topography; and comparing the planar coordinates of the substrate surface topography to the planar coordinates of the at least one defect to determine if the at least one defect would interfere with subsequent downstream processing of the substrate, thereby comprising a killer defect.

11. The method of claim 10 wherein the substrate surface topography comprises topography selected from the group consisting of dense array information, active areas, memory areas and cell areas.

12. The method of claim 10 further including the steps of:

comparing the planar coordinates of the substrate surface topography to the planar coordinates of the at least one defect to determine if the at least one defect would not interfere with subsequent downstream processing of the substrate, thereby comprising a non-killer defect; and allowing the non-killer defect to remain on the substrate surface.

13. The method of claim 10 further including the steps of:

comparing the planar coordinates of the substrate surface topography to the planar coordinates of the at least one defect to determine if the at least one defect comprises an uncorrectable light point defect; and allowing the uncorrectable light point defect to remain on the substrate surface.

14. A method for removing undesirable contaminants from a substrate surface comprising the steps of:

scanning a substrate surface to locate a plurality of defects thereon the substrate surface;

identifying x, y coordinates of each of the plurality of defects;

determining x, y coordinates of any substrate surface topography;

comparing the x, y coordinates of each of the plurality of defects to the x, y coordinates of the substrate surface topography to determine whether each of the plurality of defects is a defect selected from the group consisting of a killer defect, a non-killer defect and a light point defect;

allowing those of the plurality of defects identified as non-killer defects to remain on the substrate surface;

allowing those of the plurality of defects identified as light point defects to remain on the substrate surface; and removing those of the plurality of defects identified as killer defects using a laser by positioning the killer defect in the direct path of a laser beam emitted from the laser whereby the laser beam contacts the killer defect to enable selective removal of the killer defect by laser ablation while leaving the substrate surface area surrounding the killer defect substantially intact.

15. The method of claim 14 wherein the killer defects have diameters ranging from about 0.1 $\mu$m to about 0.25 $\mu$m, and the laser emits a laser beam having diameters ranging from about 0.1 $\mu$m to about 0.25 $\mu$m so as to remove each of the killer defects at each x, y coordinate.

16. The method of claim 14 wherein the laser emits a laser beam that is adapted to simultaneously remove a plurality of defects identified as killer defects.

17. The method of claim 16 wherein the laser beam is adapted to simultaneously remove the plurality of defects identified as killer defects by splitting the laser beam using a beam splitter selected from the group consisting of diffraction graters, mirrors and optics.

18. The method of claim 14 wherein the laser comprises a femtosecond laser that emits a laser beam having a diameter the same size as a diameter of a targeted killer defect to be removed so that the laser beam contacts the targeted killer defect at its x, y coordinates, the laser beam removing the killer defect at a rate that is faster than the substrate can be heated thereby avoiding substrate surface damage.

* * * * *